United States Patent
Hashimoto

(10) Patent No.: US 10,444,294 B2
(45) Date of Patent: Oct. 15, 2019

(54) ELECTRICITY STORAGE DEVICE PRODUCTION METHOD AND STRUCTURE BODY INSPECTION DEVICE

(71) Applicant: J.E.T. CO., LTD., Asakuchi-gun, Okayama (JP)

(72) Inventor: Shigeki Hashimoto, Okayama (JP)

(73) Assignee: J.E.T. CO., LTD., Okayama (JP)

( * ) Notice: Subject to any disclaimer, the term of this patent is extended or adjusted under 35 U.S.C. 154(b) by 200 days.

(21) Appl. No.: 15/547,140

(22) PCT Filed: Jan. 28, 2016

(86) PCT No.: PCT/JP2016/052490
§ 371 (c)(1),
(2) Date: Jul. 28, 2017

(87) PCT Pub. No.: WO2016/125679
PCT Pub. Date: Aug. 11, 2016

(65) Prior Publication Data
US 2018/0011144 A1   Jan. 11, 2018

(30) Foreign Application Priority Data
Feb. 3, 2015   (JP) .................... 2015-019178

(51) Int. Cl.
G01R 31/387 (2019.01)
G01R 31/385 (2019.01)
(Continued)

(52) U.S. Cl.
CPC ......... G01R 31/387 (2019.01); G01R 31/389 (2019.01); G01R 31/3865 (2019.01);
(Continued)

(58) Field of Classification Search
CPC .............. G01R 31/367; G01R 31/3634; G01R 31/3641; G01R 31/3648; G01R 31/3865;
(Continued)

(56) References Cited

U.S. PATENT DOCUMENTS 6,420,851 B1 * 7/2002 Schoofs ............. G01R 31/3835
                                                       320/132
9,076,601 B2 * 7/2015 Yamashita ............. H01G 11/06
(Continued)

FOREIGN PATENT DOCUMENTS

EP         1542306 A1    6/2005
JP         53-66543 A    6/1978
(Continued)

OTHER PUBLICATIONS

International Search Report of PCT/JP2016/052490.
The extended European search report of corresponding application EP16746510 dated Jul. 25, 2018.

*Primary Examiner* — Son T Le
*Assistant Examiner* — Dustin R Dickinson
(74) *Attorney, Agent, or Firm* — Muncy, Geissler, Olds & Lowe, P.C.

(57) ABSTRACT

An inspection device (20) for inspecting a structure body (10) including a pair of electrodes and a separator disposed between the pair of electrodes is provided, the inspection device (20) includes: a measurement unit (30) including a direct-current constant voltage generator (32) that generates a constant inspection voltage applied to the pair of electrodes, and a detection circuit (34) that detects a current value between the pair of electrodes resulting from the application of the inspection voltage; and a processing unit (50) that determines whether the structure body (10) is defective or non-defective based on the detected current value, and the processing unit (50) has a function that, if two or more points at which a ratio ($\Delta I/\Delta t$) of a current value (Continued)

variation amount (ΔI) to a time variation amount (Δt) varies from a value of no less than 0 to a negative value are observed or no point at which the ratio (ΔI/Δt) varies from a value of no less than 0 to a negative value is observed during a period of time immediately after the application of the inspection voltage until the current value becomes constant, determines the structure body (10) as a defective product, and an auxiliary function that obtains a peak current value $I_{peak}$, a peak current appearing time $t_{peak}$ and a current area $S_I$ of a current waveform representing variation in current value I over passage of time t, and if any one of the peak current value $I_{peak}$, the peak current appearing time $t_{peak}$ and the current area $S_I$ deviates from a preset threshold value including an upper limit value and a lower limit value, determines the structure body as a defective product.

2 Claims, 4 Drawing Sheets

(51) Int. Cl.
| | | |
|---|---|---|
| *H01G 11/84* | (2013.01) | |
| *H01G 13/00* | (2013.01) | |
| *H01M 10/04* | (2006.01) | |
| *H01M 10/0587* | (2010.01) | |
| *H01M 10/42* | (2006.01) | |
| *G01R 31/389* | (2019.01) | |

(52) U.S. Cl.
CPC ............. *H01G 11/84* (2013.01); *H01G 13/00* (2013.01); *H01M 10/04* (2013.01); *H01M 10/0587* (2013.01); *H01M 10/4285* (2013.01); *Y02E 60/13* (2013.01)

(58) Field of Classification Search
CPC . G01R 31/3828; G01R 31/387; H01M 10/04; H01M 10/446; H01M 10/0587; H01M 10/4285; H01G 11/84; H01G 13/00
See application file for complete search history.

(56) References Cited

U.S. PATENT DOCUMENTS

| | | | |
|---|---|---|---|
| 2005/0242820 | A1 | 11/2005 | Kume et al. |
| 2009/0160402 | A1* | 6/2009 | Wang ................ H01M 10/4285 320/134 |

FOREIGN PATENT DOCUMENTS

| | | |
|---|---|---|
| JP | 58-28181 A | 2/1983 |
| JP | 2004-20387 A | 1/2004 |
| JP | 2004-111371 A | 4/2004 |
| JP | 4313625 B2 | 8/2009 |
| JP | 2011-28931 A | 2/2011 |
| JP | 2012-123914 A | 6/2012 |

* cited by examiner

ELECTRICITY STORAGE DEVICE PRODUCTION METHOD AND STRUCTURE BODY INSPECTION DEVICE

TECHNICAL FIELD

The present invention relates to a power storage device production method and a structure body inspection device.

BACKGROUND ART

Power storage devices such as batteries each include a structure body including a positive electrode and a negative electrode disposed via a separator. A defect in the structure body leads to a defect in the power storage device, and thus, in production of power storage devices, it is necessary to detect a structure body in which an abnormal event such as a short or an open occurs between the positive electrode and the negative electrode.

In general, detection of an abnormal event occurring in a structure body is performed by measuring an insulation resistance using, e.g., a megohmmeter. Where a megohmmeter is used, acceptability determination is made based on a resistance value in a limited period of time immediately before a current value after application of an inspection voltage converges. More specifically, a direct-current voltage is applied to the structure body, a value of the applied voltage and a value of flowing current after a certain period of time are measured, and a resistance value is calculated from the measured applied voltage value and current value. Since such resistance value after a certain period of time calculated as above is used for acceptability determination, and where a megohmmeter is used, it is difficult to fully detect an abnormal event during the inspection of the structure body.

A method in which, while an inspection voltage is applied to a precursor of a secondary battery such as a structure body, a current flowing as a result of the inspection voltage application is measured at a predetermined time interval to detect an abnormal event between a positive electrode and a negative electrode has been provided (for example, Patent Literature 1). In this method, a result of the measurement is compared with an acceptable range based on a preset reference value, and if the result has a value failing beyond the acceptable range, the precursor is determined as a defective product.

CITATION LIST

Patent Literature

Patent Literature 1: Japanese Patent No. 4313625

SUMMARY OF INVENTION

Technical Problem

However, the above method described in Patent Literature 1 requires a reference value obtained from non-defective products, for the aforementioned comparison with the acceptable range. In addition, in the method described in Patent Literature 1, it is necessary to provide a direct-current voltage generator and a current/voltage detector, individually, as separate devices.

Therefore, an object of the present invention is to provide a method for producing a power storage device and a structure body inspection device that enables more reliable determination of whether a structure body is detective or non-defective.

Solution to Problem

A method for producing a power storage device according to the present invention is a power storage device production method including a step of inspecting a structure body including a pair of electrodes and a separator disposed between the pair of electrodes, the step of inspecting the structure body including: a step of measuring a current value between the pair of electrodes resulting from an application of an constant inspection voltage at a predetermined interval, the inspection voltage being applied between the pare of electrodes, and determining the structure body as a defective product when two or more points at which a ratio ($\Delta I/\Delta t$) of a current value variation amount ($\Delta I$) to a time variation amount ($\Delta t$) varies from a value of no less than 0 to a negative value are observed or no point at which the ratio ($\Delta I/\Delta t$) varies from a value of no less than 0 to a negative value is observed during a period of time immediately after the application of the inspection voltage until the current value becomes constant; and an auxiliary step of obtaining a peak current value $I_{peak}$, a peak current appearing time $t_{peak}$ and a current area $S_I$ of a current waveform representing variation in current value I over passage of time t, and determining the structure body as a defective product when any one of the peak current value $I_{peak}$, the peak current appearing time $t_{peak}$ and the current area $S_I$ deviates from a preset threshold value including an upper limit value and a lower limit value.

An inspection device according to the present invention is an inspection device for inspecting a structure body including a pair of electrodes and a separator disposed between the pair of electrodes, the inspection device including: a measurement unit including a direct-current constant voltage generator that generates a constant inspection voltage applied to the pair of electrodes and a detection circuit that detects a current value between the pair of electrodes resulting from the application of the inspection voltage; and a processing unit that determines whether the structure body is defective or non-defective based on the detected current value, wherein the processing unit has a function that determines the structure body as a defective product, when two or more points at which a ratio ($\Delta I/\Delta t$) of a current value variation amount ($\Delta I$) to a time variation amount ($\Delta t$) varies from a value of no less than 0 to a negative value are observed or no point at which the ratio ($\Delta I/\Delta t$) varies from a value of no less than 0 to a negative value is observed during a period of time immediately after the application of the inspection voltage until the current value becomes constant, and an auxiliary function that obtains a peak current value $I_{peak}$, a peak current appearing time $t_{peak}$ and a current area $S_I$ of a current waveform representing variation in current value I over passage of time t, and determines the structure boy as a defective product when any one of the peak current value $I_{peak}$, the peak current appearing time $t_{peak}$ and the current area $S_I$ deviates from a preset threshold value including an upper limit value and a lower limit value.

Advantageous Effect of Invention

According to the present invention, in a step of inspecting a structure body including a pair of electrodes and a separator disposed between the pair of electrodes, while a constant inspection voltage is applied between the pair of electrodes, a current value between the pair of electrodes resulting from the application of the inspection voltage is measured at a predetermined interval. Focusing on a ratio ($\Delta I/\Delta t$) of a current value variation amount ($\Delta I$) to a time variation amount ($\Delta t$), if two or more points at which the ratio ($\Delta I/\Delta t$) varies from a value of no less than 0 to a negative value are observed or no point at which the ratio ($\Delta I/\Delta t$) varies from a value of no less than 0 to a negative value is observed during a period of time immediately after the application of the inspection voltage until the current value becomes constant, the structure body is determined as a defective product. In addition, any one of a peak current value $I_{peak}$, a peak current appearing time $t_{peak}$ and a current area $S_I$ of a current waveform representing variation in current value I over passage of time t deviates from a preset threshold value including an upper limit value and a lower limit value, the structure body is determined as a defective product. Thus, a short or an open in a structure body is more reliably detected in a simplified manner, enabling production of a highly reliable power storage device.

DESCRIPTION OF EMBODIMENT

An embodiment according to the present invention will be described in detail below with reference to the drawings.
1. Overcall Configuration
(Structure Body)

Figure 1:
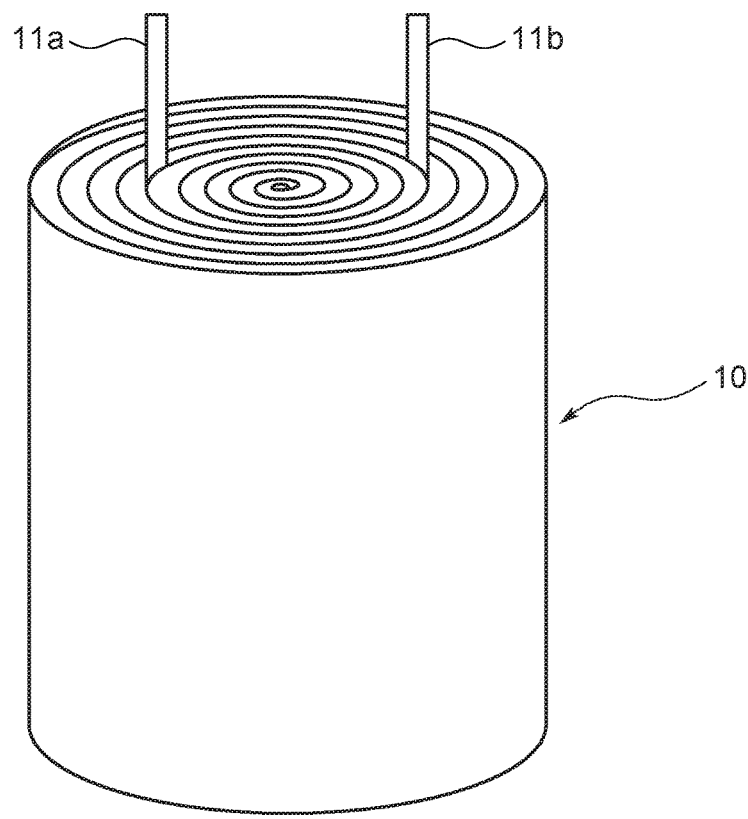
FIG. 1 is a diagram schematically illustrating an example of a structure body to be inspected by an inspection device according to the present embodiment.
Figure 2:
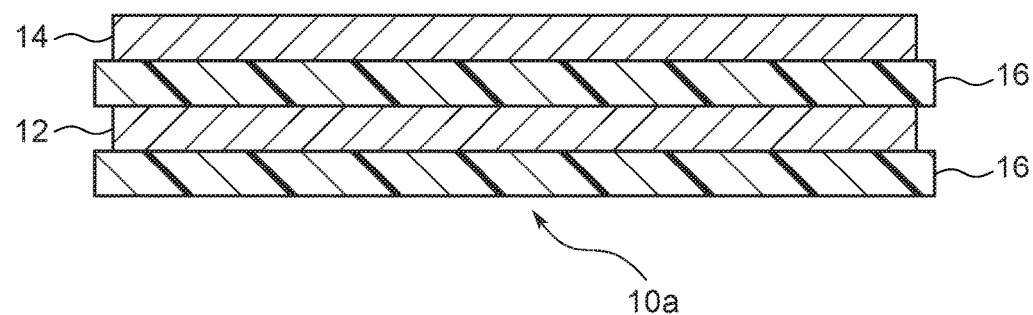
FIG. 2 is a cross-sectional diagram illustrating a stack body for fabricating a structure body having a wound-type structure.

First, a structure body to be employed for an inspection device according to the present embodiment will be described. As the structure body, for example, a structure body 10 having a wound-type structure such as the one illustrated in FIG. 1 can be used. As illustrated in FIG. 2, the structure body 10 is fabricated by stacking a band-like positive electrode 12 and a band-like negative electrode 14 via band-like separators 16 to form a stack body 10a and winding multiple turns of the stack body 10a with a winding core as a center and then removing the winding core. In the structure body 10, a positive electrode lead 11a and a negative electrode lead 11b are provided. An end of the positive electrode lead 11a is connected to a positive electrode 12, and an end of the negative electrode lead 11b is connected to the negative electrode 14.
(Inspection Device)

Figure 3:
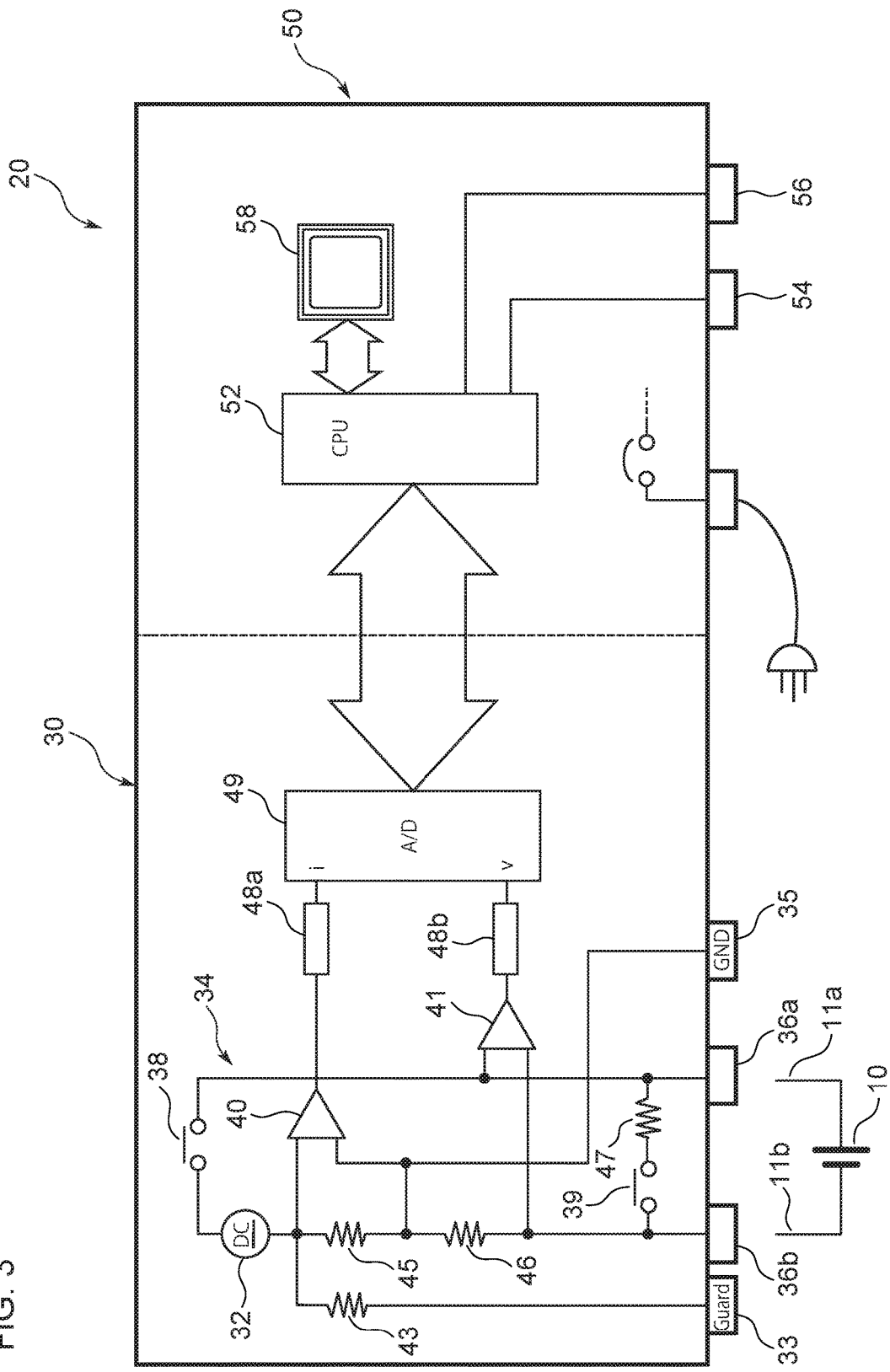
FIG. 3 is a block diagram illustrating a control configuration of the structure body inspection device according to the present embodiment.

An inspection device for the structure body 10 according to the present embodiment wild be described. In FIG. 3, reference numeral 20 denotes an entire inspection device, which includes a measurement unit 30 and a processing unit 50. The measurement unit 30 measures an electric characteristic between the positive electrode 12 and the negative electrode 14 based on a measurement instruction signal sent from the processing unit 50, and outputs a measurement signal to the processing unit 50. The processing unit 50 determines whether the structure body 10 is defective or non-defective based on the measurement signal output from the measurement unit 30.

The measurement unit 30 includes a direct-current constant voltage generator 32, a current detection circuit 34, two terminals 36a, 36b, and a guard electrode 33 and a GND electrode 35. The positive electrode lead 11a and the negative electrode lead 11b of the structure body 10 are connected to the two terminals 36a and 36b, respectively. The direct-current constant voltage generator 32 can provide a voltage of 50 to 1000 V.

One terminal 36b is connected to the direct-current constant voltage generator 32 via resistors 46, 45. The direct-current constant voltage generator 32 is connected to an end of a voltage generation switch 38. The other terminal 36a is connected to an inverting input terminal of an operational amplifier 41 and another end of the voltage generation switch 38. A non-inverting input terminal of the operational amplifier 41 is connected to the one terminal 36. An output terminal of the operational amplifier 41 is connected to an analog/digital (A/D) converter 49 via a filter 48b. Between the terminals 36a and 36b, a discharge switch 39 and a resistor 47 are connected in series.

The guard electrode 33 is connected to an inverting input terminal of an operational amplifier 40 via a resistor 43. A non-inverting input terminal of the operational amplifier 40 is connected to the GND electrode 35. An output terminal of the operational amplifier 40 is connected to an analog/digital (A/D) converter 49 via a filter 48a. The analog/digital (A/D) converter 49 samples analog output signals output from the operational amplifiers 40, 41 at a predetermined time interval (hereinafter, referred to as "measurement interval"), converts the analog output signals into digital measurement signals and outputs the digital measurement signals to the processing unit 50.

The measurement unit 30 applies an inspection voltage to the structure body 10, and measures an electric characteristic between the positive electrode 12 and the negative electrode 14 resulting from the inspection voltage application, in the case of the present embodiment, a value of current flowing between the positive electrode 12 and the negative electrode 14 until end of predetermined inspection time. Then, the measurement unit 30 outputs the measured current value to the processing unit 50 as a measurement signal.

The processing unit 50 includes a control unit 52 and a touch panel 58. The control unit 52 includes, e.g., a CPU (central processing unit), a ROM (read-only memory) and a RAM (random access memory), and comprehensively controls the entire inspection device 20. The touch panel 58 has functions such as inspection parameter setting, status display, and measurement result and inspection result display.

Examples of inspection parameters set in the touch panel 58 include an inspection voltage applied to the structure body 10, a current value measurement interval, and inspection time. The inspection voltage can arbitrarily be set according to the type of the structure body 10, and generally around 50 to 750 V. The current value measurement interval can arbitrarily be set within a range of around 1 μsec to 1 msec. In order to obtain a more precise measurement result, it is preferable that a current value be measured at a measurement interval of no more than 1 msec. The inspection time differs depending on the type of the structure body 10, and generally is around several msec to ten sec.

The control unit 52 configured as described above performs determination of whether the structure body 10 is defective or non-defective processing upon receipt of a measurement signal output from the measurement unit 30. First, the control unit 52 calculates a current value variation amount ($\Delta I=I_{n+1}-I_n$) (n is an integer) as a characteristic value variation amount at a predetermined measurement interval from a start of measurement to an end of inspection time, based on the measurement signal. Next, the control unit 52 sequentially calculates a ratio ($\Delta I/\Delta t$) of the current variation amount ($\Delta I$) to a time variation amount ($\Delta t$) with the measurement interval of measurement of the current value as the time variation amount ($\Delta t$). Then, the control unit 52 counts the number of times of variation of the ratio ($\Delta I/\Delta t$) of the current variation amount ($\Delta I$) to the time variation amount ($\Delta t$) from a value of no less than 0 to a negative value. If the number of times of variation of the ratio ($\Delta I/\Delta t$) from a value of no less than 0 to a negative value from the start of the measurement to the end of the measurement time is no less than two, the control unit 52 determines the inspection target structure body 10 as a defective product. If the number of times of variation of the ratio ($\Delta I/\Delta t$) from a value of no less than 0 to a negative value from the start of the measurement to the end of the measurement time is zero, also, the control unit 52 determines the inspection target structure body 10 as a defective product. The control unit 52 generates a determination signal based on a result of the determination, and outputs the determination signal to the touch panel 58. The touch panel 58 can display the determination result based on the determination signal.

Also, the touch panel 58 can display a current waveform representing variation in current value I over passage of the time t, measured in the measurement unit 30. If the structure body 10 is determined as a defective product, the current waveform can be displayed as an abnormal waveform including a temporary fluctuation reflecting an abnormal event. Depending on the settings, if the inspected structure body 10 is determined as a non-defective product, the touch panel 58 can also display a current waveform thereof. The touch panel 58 can have a function that enlarges and displays a temporary fluctuation in an abnormal waveform.

Figure 4:
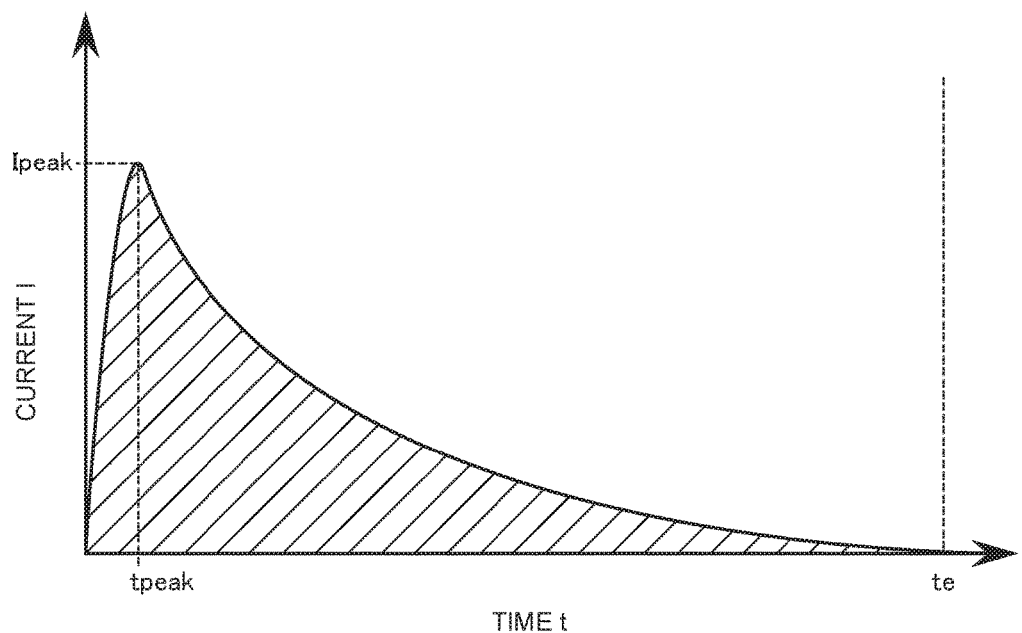
FIG. 4 is a diagram illustrating an example of a current waveform of a non-defective structure body.

Furthermore, the control unit 52 has an auxiliary function that compares a predetermined parameter value of a current waveform with a preset threshold value. For example, in a current waveform of a non-defective structure body 10, as indicated in FIG. 4, a peak current value $I_{peak}$ is shown at a peak current appearing time $t_{peak}$. In this case, a current area $S_I$ for a period from inspection voltage application to an inspection end time point $t_e$ is the area of the region shaded in the FIG.

Where the auxiliary function is used, parameters such as a peak current value $I_{peak}$, a peak current appearing time $t_{peak}$ and a current area $S_I$ in a current waveform of a non-defective structure body 10 as reference values, and acceptable upper limit value and acceptable lower limit value are set as threshold values for the respective parameters. The non-defective structure body 10 is, for example, a structure body 10 that causes no problem in initial battery characteristic and also causes no problem in characteristic after no less than 50 charge-discharge cycles. Also, the reference values of the parameters can be values obtained by averaging a plurality of charging current waveforms obtained by measurement of a plurality of non-defective structure bodies 10.

For the peak current value $I_{peak}$, an upper limit value $I_{upper}$ and a lower limit value $I_{lower}$ are set, and for the peak current appearing time $t_{peek}$, an upper limit value $t_{upper}$ and a lower limit value $t_{lower}$ are set. Furthermore, for the current area $S_I$, an upper limit value $S_{upper}$ and a lower limit value $S_{lower}$ are set. The acceptable upper and lower limit values of each parameter can arbitrarily be set according to, e.g., the type of the structure body 10. The threshold values including an upper limit value and a lower limit value are set as inspection parameters on the touch panel 58 of the processing unit 50. The set threshold values are stored in a storage unit of the control unit 52.

The storage unit of the control unit 52 may hold the peak current value $I_{peak}$ and the threshold values thereof (the upper limit value $I_{upper}$ and the lower limit value $I_{lower}$), the peak current appearing time $t_{peak}$ and the threshold values thereof (the upper limit value $t_{upper}$ and the lower limit value $t_{lower}$) and the current area $S_I$ and the threshold values thereof (the upper limit value $S_{upper}$ and the lower limit value $S_{lower}$) in advance. In this case, when a plurality of non-defective products are measured in the measurement unit 30, a plurality of obtained results are output to the processing unit 50 as measurement signals and stored in the storage unit of the control unit 52 in the control unit 50. The control unit 52 averages the plurality of measurement results to calculate reference values (a peak current value $I_{peak}$, a peak current appearing time $t_{peak}$ and a current area $S_1$), sets threshold values based on the plurality of measurement results and stores the threshold values in the storage unit.

The control unit 52 receives the measurement signal output from the measurement unit 30 and calculates values of a peak current value, a peak current appearing time and a current area. The control unit 52 compares the values of the peak current value, the peak current appearing time and the current area obtained as described above with the respective threshold values, and if any one of the peak current value, the peak current appearing time and the current area deviates from the threshold values, determines the structure body 10 as a defective product.

The measurement signal output from the measurement unit 30 and the determination signal output from the control unit 52 can be output to external devices (not illustrated) via interfaces 54, 56. The measurement signal output to an external device can be copied on a medium such as a memory card. In this case, the current values measured at a regular interval can be confirmed via a computer that is other than the inspection device 20.

2. Operation and Effects

Operation and effects of the inspection device 20 configured as described above will be described. The positive electrode 12 and the negative electrode 14 of the structure body 10 are connected to the pair of terminals 36a, 36b via the positive electrode lead 11a and the negative electrode lead 11b, respectively, and an inspection is started. First, the measurement unit 30 applies a predetermined inspection voltage between the positive electrode 12 and the negative electrode 14 based on a measurement instruction signal sent from the processing unit 50. Upon the application of the inspection voltage, charge accumulates in the positive electrode 12 and the negative electrode 14 and a current flows. The current increases immediately after the inspection voltage application, and upon accumulation of sufficient charge in the positive electrode 12 and the negative electrode 14, gradually decreases and becomes constant. For example, in the case of a non-defective structure body 10 in which no abnormal event such as a short or an open occurs between the positive electrode 12 and the negative electrode 14, as indicated in FIG. 4, after the voltage application, a peak current value $I_{peak}$ is observed at a time of $t=t_{peak}$. After the peak current value $I_{peak}$ is reached, the current value continues decreasing, and finally becomes zero after continuous flow of the current having a very small value.

Simultaneously with the application of the inspection voltage, the measurement unit 30 measures the current value of the current flowing between the positive electrode 12 and the negative electrode 14 as a result of the application of the inspection voltage, and outputs the current value to the processing unit 50 as a measurement signal.

The processing unit 50 sequentially calculates a ratio ($\Delta I/\Delta t$) of a current variation amount ($\Delta I$) to a time variation amount ($\Delta t$) based on the measurement signal. In the current waveform indicated in FIG. 4, after the voltage application, at a time of $t<t_{peak}$, the ratio ($\Delta I/\Delta t$) of the current variation amount ($\Delta I$) to the time variation amount ($\Delta t$) has a value of no less than 0. On the other hand, at a subsequent time of $t_{peak}<t<t_e$, the ratio ($\Delta I/\Delta t$) of the current variation amount ($\Delta I$) to the time variation amount ($\Delta t$) is a negative value. In the current waveform indicated in FIG. 4, there is only one point at which the ratio ($\Delta I/\Delta t$) varies from a value of no less than 0 to a negative value.

Figure 5:
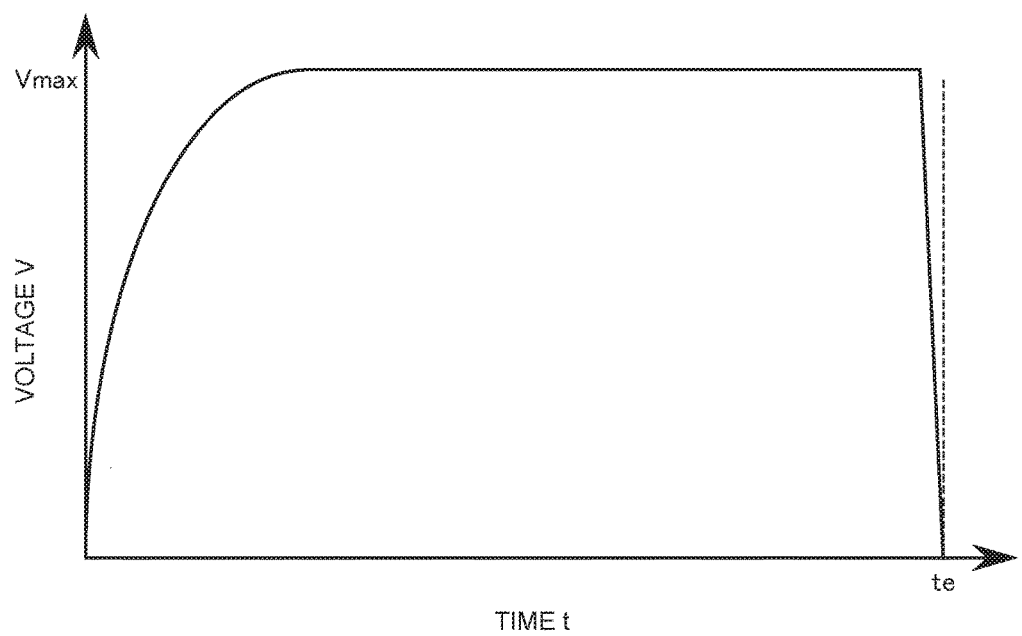
FIG. 5 is a diagram illustrating an example of a voltage waveform of a non-defective structure body.

In the case of the non-defective structure body 10 exhibiting such current waveform, as indicated in FIG. 5, the measured voltage gradually increases from the start of the application of the inspection voltage and reaches a maximum voltage value $V_{max}$ in a predetermined period of time. The maximum voltage value $V_{max}$ is a value that is substantially equal to the value of the applied inspection voltage. As indicated in the figure, the voltage value exhibits a constant value ($V_{max}$) without variation until the end of the application of the inspection voltage.

Figure 6:
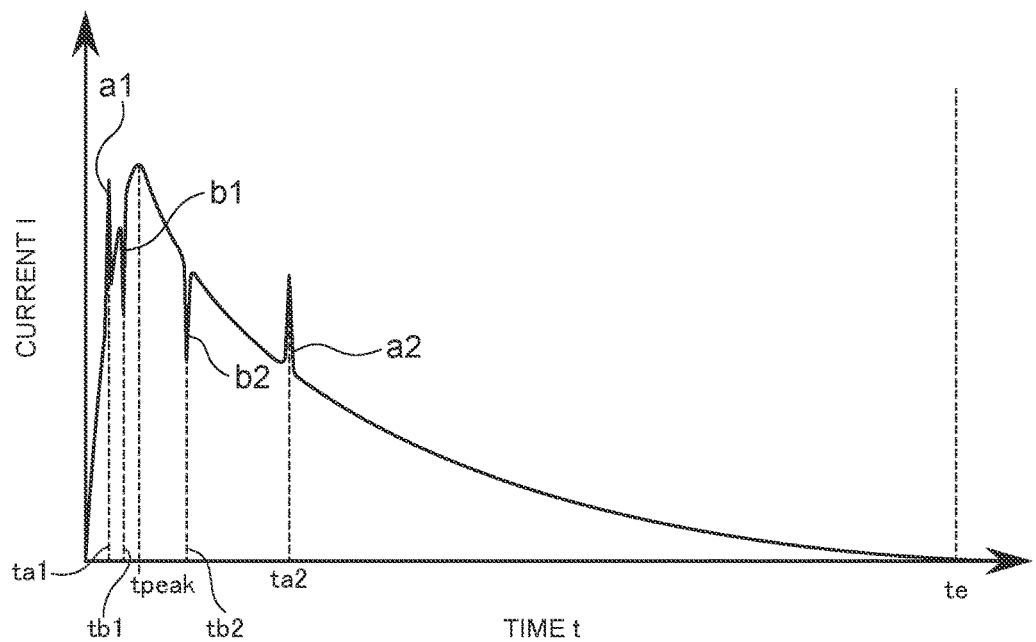
FIG. 6 is a diagram illustrating an example of a current waveform of a defective structure body.

On the other hand, even in the case of a structure body 10 having a configuration that is similar to the above, if an abnormal event such as a short or an open occurs between the positive electrode 12 and the negative electrode 14 during an inspection, in a current waveform obtained in such a manner as described above, for example, temporary fluctuations such as indicated in FIG. 6 occur. In the indicated current waveform, a first local maximal point a1 is shown at $t=t_{a1}$, and a first local minimal point b1 is shown at $t=t_{b1}$. Also, a second local minimal point b2 is shown at $t=t_{b2}$, and a second local maximal point a2 is shown at $t=t_{a2}$.

The current waveform of the non-defective structure body 10 indicated in FIG. 4 does not have fluctuations such as local maximal points and local minimal points. The local maximal points a1, a2 shown in the current waveform indicated in FIG. 6 each reflect occurrence of a short between the positive electrode 12 and the negative electrode 14 of the structure body 10. On the other hand, the local minimal points b1, b2 each reflect occurrence of an open between the positive electrode 12 and the negative electrode 14 of the structure body 10.

Here, if an open state continues between the positive electrode 12 and the negative electrode 14 of the structure body 10, the current value becomes zero. If the state in which the current value is zero lasts for a predetermined period of time or more, the open state of the structure body 10 can also be recognized. In the current waveform when the open state continues, no point at which the ratio ($\Delta I/\Delta t$) varies from a value of no less than 0 to a negative value is observed. On the other hand, if a short state continues between the positive electrode 12 and the negative electrode 14 of the structure body 10, the current continues flowing, and thus, in the current waveform, no point at which the ratio ($\Delta I/\Delta t$) varies from a value of no less than 0 to a negative value is observed. In each case, there is no point at which the ratio ($\Delta I/\Delta t$) varies from a value of no less than 0 to a negative value. In this case, the structure body 10 is determined as a defective product.

As described above, from fluctuations occurred in the current waveform, occurrence of abnormal events such as shorts or opens in the structure body 10 can be recognized. More specifically, from a local maximal point in the current waveform, occurrence of a short between the positive electrode 12 and the negative electrode 14 in the structure body 10 can be recognized, and from a local minimal point, occurrence of an open between the positive electrode 12 and the negative electrode 14 in the structure body 10 can be recognized.

In the current waveform indicated in FIG. 6, focusing on parts before and after $t=t_{a1}$ at which the first local maximal point a1 is shown, the ratio ($\Delta I/\Delta t$) of the current value variation amount ($\Delta I$) to the time variation amount ($\Delta t$) is a value of no less than 0 at $t<t_{a1}$, and is a negative value at $t>t_{a1}$. The ratio ($\Delta I/\Delta t$) of the current value variation amount ($\Delta I$) to the time variation amount ($\Delta t$) varies from a value of no less than 0 to a negative value at $t=t_{a1}$. Likewise, at $t=t_{a2}$ at which the second local maximal point a2 is shown, the ($\Delta I/\Delta t$) of the current value variation amount ($\Delta I$) to the time variation amount ($\Delta t$) varies from a value of no less than 0 to a negative value.

As described with reference to FIG. 4, in the case of a non-defective structure body 10, there is only one point at which the ratio ($\Delta I/\Delta t$) varies from a value of no less than 0 to a negative value in the current waveform, which is a point of the peak current value $I_{peak}$. In the current waveform indicated in FIG. 6, it can be seen that, in addition of this point, there are two points at which the ratio ($\Delta I/\Delta t$) of the current value variation amount ($\Delta I$) to the time variation amount ($\Delta t$) varies from a value of no less than 0 to a negative value.

As described above, if two or more points at which the ratio ($\Delta I/\Delta t$) of the current value variation amount ($\Delta I$) to the time variation amount ($\Delta t$) varies from a value of no less than 0 to a negative value are observed, the structure body 10 is determined as a defective product.

Here, focusing on parts before and after $t=t_{b1}$ at which the first local minimal point b1 is shown in the current waveform indicated in FIG. 6, $t_{b1}$ is a time before the peak current value $I_{peak}$ is shown, and thus, the ratio ($\Delta I/\Delta t$) of the current value variation amount ($\Delta I$) to the time variation amount ($\Delta t$) varies from a value of no less than 0 to a negative value in a time period of $t<t_{b1}$. Also, at $t=t_{b2}$ at which the second minimal point b2 is shown, which is a point of time after the occurrence of the peak current value $I_{peak}$, and thus, in a process of recovery from the second local minimal point b2, the ratio ($\Delta I/\Delta t$) of the current value variation amount ($\Delta I$) to the time variation amount ($\Delta t$) varies from a value of no less than 0 to a negative value. As described above, where a local minimal point is shown, also, as in the case where a local maximal point is shown, if two or more points at which the ratio ($\Delta I/\Delta t$) of the current value variation amount ($\Delta I$) to the time variation amount ($\Delta t$) varies from a value of no less than 0 to a negative value are observed, the structure body 10 can be determined as a defective product.

Although the structure body 10 included in a small battery such as a consumer-use lithium-ion secondary battery has been described above, the same applies to a structure body 10 included in a large battery such as an in-vehicle lithium-ion secondary battery.

The inspection device according to the present embodiment observes a current waveform, and determines whether a structure body 10 is defective or non-defective based on the number of points at which a ratio ($\Delta I/\Delta t$) of a current value variation amount ($\Delta I$) to a time variation amount ($\Delta t$) varies from a value of no less than 0 to a negative value. In addition, values of a peak current value, a peak current appearing time or a current area obtained from measurement results are compared with respective threshold values to determine whether the structure body 10 is defective or non-defective, enabling more reliable inspection of the structure body 10.

The structure body 10 inspected as described above can be applied to a lithium ion battery as a power storage device. For example, a structure body 10 determined as a non-defective product in an inspection is disposed in an outer can together with a non-aqueous electrolyte solution. Then, the outer can is sealed. A lithium ion battery is produced in this way. Here, the inspection of the structure body 10 may be performed before the electrolyte solution is poured into the outer can after the structure body 10 is put in the outer can.

According to the production method of the present embodiment, a defective structure body 10 in which a short or open event occurs is detected, and a power storage device is produced using a non-defective structure body 10, enabling enhancement in reliability and productivity of the power storage device.

3. Alteration

Although an example of a wound-type structure has been described as a structure body 10 to be inspected by the inspection device 20 according to the present embodiment, the present invention is not limited to this example. A structure body having a stack-type structure formed by stacking a plurality of positive electrodes 12 and a plurality of negative electrodes 14 alternately with respective separators 16 interposed therebetween may be used.

Also, the battery described in the present embodiment is an example of a power storage device produced by the method of the present invention, and the present invention is not limited to this example. Examples of the power storage device include a lithium ion battery, a lithium ion capacitor, a condenser and a nickel battery.

In a step of inspecting a structure body 10 in the production method of the present embodiment, a ratio ($\Delta I/\Delta t$) of a current variation amount ($\Delta I$) to a time variation amount ($\Delta t$) is checked, and if two or more points at which the ratio ($\Delta I/\Delta t$) varies from a value of no less than 0 to a negative value are observed, the structure body 10 is determined as a defective product. If a temporary fluctuation that is different from a peak current value $I_{peak}$ is observed in the current waveform, the structure body 10 is a defective product.

A temporary fluctuation in a current waveform may be confirmed by comparing, for example, a current value $I_n$ measured n-th (n is a positive number) with a current value $I_{n-1}$ measured n−1-th and a current value $I_{n+1}$ measured n+1-th. More specifically, it is assumed that $\Delta I_n$ is an amount of variation between the current value $I_{n-1}$ and the current value $I_n$ and $\Delta I_{n+1}$ is an amount of variation between the current value $I_n$ and the current value $I_{n+1}$. If the variation amount $\Delta I_{n+1}$ increases/decreases relative to the variation amount $\Delta I_n$ by no less than 200%, it is possible to determine that a temporary fluctuation occurs in the current waveform. Or, it is possible to compare the current value $I_n$ measured n-th with a current value $I_{n-2}$ measured n−2-th and a current value $I_{n+2}$ measured n+2-th in such a manner as described above, and make determination based on a result of the comparison in such a manner as described above.

Furthermore, it is possible to calculate, for example, a moving average value of the current waveform using an exponential moving average and find a temporary fluctuation based on the moving average value. More specifically, it is assumed that an average current value $I_{av1}$ is obtained by taking an average of a current value $I_{n+3}$ measured n+3-th, the current value $I_{n+2}$ measured n+2-th, the current value $I_{n+1}$ measured n+1-th and the current value $I_n$ measured n-th. Also, an average current value $I_{av2}$ is obtained by taking an average of a current value $I_{n+4}$ measured n+4-th, the current value $I_{n+3}$ unmeasured n+3th, the current value $I_{n+2}$ measured n+2-th and the current value $I_{n+1}$ measured n+1-th. Furthermore, an average current value $I_{av3}$ is obtained by taking an average of a current value $I_{n+5}$ measured n+5-th, the current value $I_{n+4}$ measured n+4-th, the current value $I_{n+3}$ measured n+3-th and the current value $I_{n+2}$ measured n+2-th.

It is assumed that $\Delta I_{av1}$ is a variation amount between the average current value $I_{av1}$ and the average current value $I_{av2}$ and $\Delta I_{av2}$ is a variation amount between the average current value $I_{av2}$ and the average current value $I_{av3}$. If $\Delta I_{av2}$ increases/decreases relative to $\Delta I_{av1}$ by no less than 200%, a temporary fluctuation can be determined as occurring in the current waveform. Here, the number of current values for calculating an average value is not limited to four and may arbitrarily be set.

As the average value, an average value of the current value $I_n$ measured n-th, a current value $I_{n-j}$ measured n−j-th (j is a positive number) and a current value $I_{n+j}$ measured n+j-th (j is a positive number) may be used. In this case, the value of j may arbitrarily be set.

Or, the current value $I_{n+3}$ measured n+3-th may be compared with an average current value $I_{av3}$ of the current value $I_{n+2}$ measured n+2-th, the current value $I_{n+1}$ measured n+1-th and the current value $I_n$ measured n-th. As with the above case, if the current value $I_{n+3}$ increases/decreases relative to the average current value $I_{av3}$ by no less than 200%, it can be determined that a temporary fluctuation occurs in the current waveform. As described above, a temporary fluctuation in a current waveform can be found using any of such methods. A variation amount increase/decrease (%), based on which a temporary fluctuation is determined as occurring in a current waveform, is not fixed as 200%. The variation amount increase/decrease can arbitrarily be set according to a range in which the relevant structure body is determined as being defective. Also, whether nor not a temporary fluctuation occurs in a current waveform may be determined by comparison using an absolute value of a variation amount, not a variation amount increase/decrease (%).

In order to inspect whether or not a temporary fluctuation occurs in a current waveform using the above-described method, for example, a predetermined parameter to be used for current value comparison is set as an inspection parameter on the touch panel 58 of the processing unit 50 of the inspection device 20.

Although the case where in the measurement unit 30 of the inspection device 20 illustrated in FIG. 3, a current value is used as an electric characteristic has been described, a voltage value may be used. In this case, a voltage waveform can be displayed on the touch panel 58 of the processing unit 50 of the inspection device 20. For example, in the case of the structure body 10 exhibiting the current waveform indicated in FIG. 6, as indicated in FIG. 7, a short between the positive electrode 12 and the negative electrode 14 of the structure body 10 is expressed as local minimal points c1, c2 at times $t_{a1}$, $t_{a2}$ in the voltage waveform.

Figure 7:
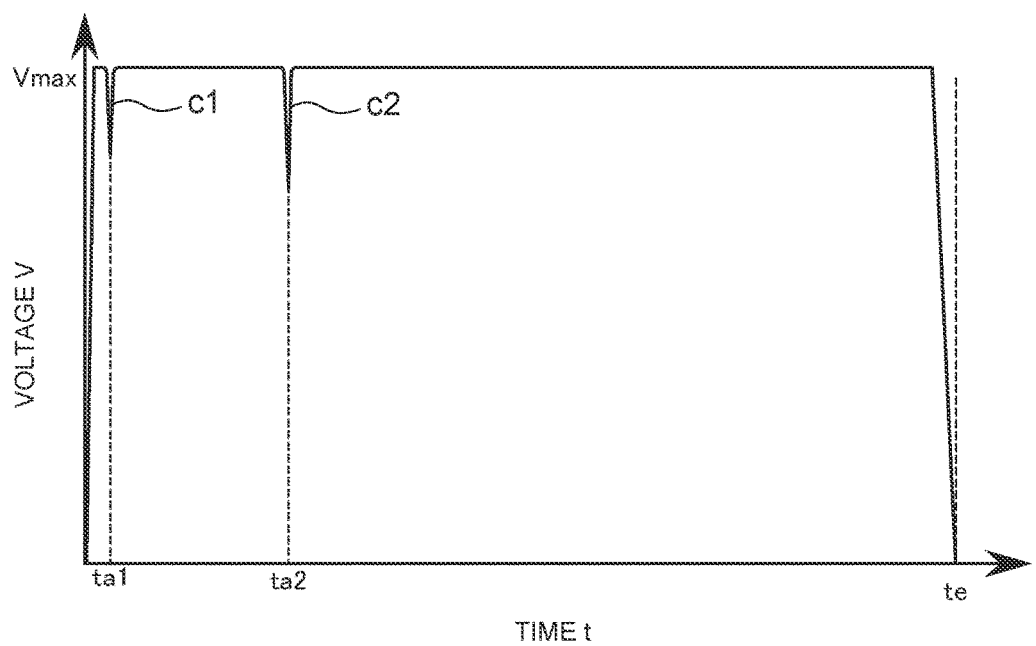
FIG. 7 is a diagram illustrating an example of a voltage waveform of a defective structure body.

In FIG. 7, except the local minimal points, there is one point in the voltage waveform at which a ratio ($\Delta V/\Delta t$) of a voltage variation amount (ΔV) to a time variation amount (Δt) varies from a value of no less than 0 to a negative value. Also, in a process leading to each local minimal point, the ratio (ΔV/Δt) varies from a value of no less than 0 to a negative value. Therefore, where the voltage value is used, as in the above-described embodiment, it is possible to determine the structure body 10 as being defective if there are two or more points at which the ratio (ΔV/Δt) varies from a value of no less than 0 to a negative value, enabling provision of effects that are similar to those of the above-described embodiment.

As in the case where a current waveform is displayed, if an inspected structure body 10 is determined as a non-defective product, the touch panel 58 can display a voltage waveform of the structure body 10. Also, as in the case of a current value, a voltage value, as a measurement signal, can be output to an external device. Furthermore, the voltage value can be copied on a predetermined medium so that a voltage measured during a certain period of time can be checked on a computer that is different from the inspection device 20.

Also, if a short state continues between the positive electrode 12 and the negative electrode 14 of the structure body 10, the voltage value becomes zero. If the state in which the voltage value is zero lasts for a predetermined period of time or more, a short state of the structure body 10 can be recognized.

If the state between the positive electrode 12 and the negative electrode 14 structure body 10 is not recovered from a short state or an open state, such state can be detected by measuring an inner resistance value of the structure body 10. As in the cases of a current waveform and a voltage waveform, no reference values based on non-defective products are required. Also, a structure body 10 can be determined as defective by detecting an abnormal variation in a resistance waveform.

In the method for producing a power storage device according to the present embodiment, before a structure body 10 is inspected using the inspection device 20, the structure body 10 can be pressed with a constant force by, e.g., a press to make an inter-electrode distance between a positive electrode 12 and a negative electrode 14 constant. If a foreign substance enters between the positive electrode 12 and the separator 16 or between the separator 16 and the negative electrode 14 in the structure body 10, the inter-electrode distance between the positive electrode 12 and the negative electrode 14 may deviate from a normal range. When an electrode projection is generated, also, an abnormality occurs in the inter-electrode distance. Where the inter-distance is abnormally long or abnormally short, a difference in capacitance of the structure body 10 occurs.

As a result of the structure body 10 being pressed, the inter-electrode distance between the positive electrode 12 and the negative electrode 14 is made constant, enabling obtainment of a correct capacitance. The pressure in the pressing may arbitrarily be set according to the type of the structure body 10, and in general, can be set as around. 1 to 3000 Pa.

REFERENCE SIGNS LIST 10 structure body
11a positive electrode lead
11b negative electrode lead
12 positive electrode
14 negative electrode
16 separator
20 inspection device
30 measurement unit
50 processing unit

The invention claimed is:

1. A method for producing a power storage device including a step of inspecting a structure body, the structure body including a pair of electrodes and a separator disposed between the pair of electrodes, the step of inspecting the structure body comprising:

measuring a current value between the pair of electrodes resulting from an application of a constant inspection voltage at a predetermined interval, the inspection voltage being applied between the pair of electrodes;

determining that the structure body is defective when observing either at least two points or no point at which a ratio (ΔI/Δt) of a current value variation amount (ΔI) to a time variation amount (Δt) varies from a value of no less than 0 to a negative value during an inspection period of time immediately after the application of the inspection voltage until the current value becomes constant;

obtaining a peak current value $I_{peak}$, a peak current appearing time $t_{peak}$ and a current area $S_I$ of a current waveform representing variation in current value I over passage of time t during the inspection period of time; and determining that the structure body is defective when any one of the peak current value $I_{peak}$, the peak current appearing time $t_{peak}$ and the current area $S_1$ deviates from preset upper and lower limits.

2. An inspection device for inspecting a structure body including a pair of electrodes and a separator disposed between the pair of electrodes, the inspection device comprising:

a measurement unit including:
a direct-current constant voltage generator configured to generate a constant inspection voltage to be applied to the pair of electrodes; and
a detection circuit configured to detect a current value between the pair of electrodes resulting from the application of the inspection voltage; and a processing unit configured to determine whether the structure body is defective or non-defective based on the detected current value, the processing unit being configured to:

determine that the structure body is defective when observing either at least two points or no point at which a ratio (ΔI/Δt) of a current value variation amount (ΔI) to a time variation amount (Δt) varies from a value of no less than 0 to a negative value during an inspection period of time immediately after the application of the inspection voltage until the current value becomes constant;

obtain a peak current value $I_{peak}$, a peak current appearing time $t_{peak}$ and a current area $S_1$ of a current waveform representing variation in current value I over passage of time t during the inspection period of time; and determine that the structure body is defective when any one of the peak current value $I_{peak}$, the peak current appearing time $t_{peak}$ and the current area $S_I$ deviates from preset upper and lower limits.

* * * * *